US012136637B2

(12) United States Patent
Bonakdar et al.

(10) Patent No.: US 12,136,637 B2
(45) Date of Patent: Nov. 5, 2024

(54) FLARE-BLOCKING IMAGE SENSOR

(71) Applicant: OmniVision Technologies, Inc., Santa Clara, CA (US)

(72) Inventors: Alireza Bonakdar, San Jose, CA (US); Shinn-Jhy Lian, San Jose, CA (US); Badrinath Padmanabhan, San Jose, CA (US)

(73) Assignee: OmniVision Technologies, Inc., Santa Clara, CA (US)

( * ) Notice: Subject to any disclaimer, the term of this patent is extended or adjusted under 35 U.S.C. 154(b) by 0 days.

(21) Appl. No.: 17/963,015

(22) Filed: Oct. 10, 2022

(65) Prior Publication Data
US 2023/0043844 A1    Feb. 9, 2023

Related U.S. Application Data

(62) Division of application No. 16/777,027, filed on Jan. 30, 2020, now Pat. No. 11,469,264.

(51) Int. Cl.
*H01L 27/146* (2006.01)

(52) U.S. Cl.
CPC .. *H01L 27/14623* (2013.01); *H01L 27/14605* (2013.01); *H01L 27/14621* (2013.01); *H01L 27/14627* (2013.01)

(58) Field of Classification Search
CPC ....... H01L 27/14654–14656; H01L 27/14623; H01L 27/14605; H01L 27/14621; H01L 27/14627; H01L 27/1463
See application file for complete search history.

(56) References Cited

U.S. PATENT DOCUMENTS

| 7,973,380 B2 | 7/2011 | Hsu et al. |
| 8,530,266 B1 | 9/2013 | Chen et al. |

(Continued)

FOREIGN PATENT DOCUMENTS

| CN | 103399368 A | 11/2013 |
| CN | 203365711 U | 12/2013 |

OTHER PUBLICATIONS

Chang, et al. "Shape-controlled, high fill-factor microlens arrays fabricated by a 3D diffuser lithography and plastic replication method." Optics Express 12.25 (2004): 6366-6371.

(Continued)

*Primary Examiner* — Jarrett J Stark
(74) *Attorney, Agent, or Firm* — COZEN O'CONNOR

(57) ABSTRACT

A flare-blocking image sensor includes large pixels and small pixels, a microlens, and an opaque element. The large pixels and small pixels form a first and second pixel array respectively, each having a pixel pitch $P_x$ and $P_y$. The second pixel array is offset from the first pixel array by $½P_x$ and $½P_y$. A first large pixel of the large pixels is between and collinear with a first and a second small pixel separated by $\sqrt{P_x^2+P_y^2}$ in a first direction and each having a width W less than both pixel pitch $P_x$ and $P_y$. The microlens is aligned with the first large pixel. The opaque element is between the first large pixel and the microlens and extends, in the first direction, less than $$\frac{1}{2}\left(\sqrt{P_x^2 + P_y^2} - W\right)$$

from the first small pixel toward the second small pixel. The opaque element has a width perpendicular to the first direction not exceeding width W.

16 Claims, 3 Drawing Sheets

(56) References Cited

U.S. PATENT DOCUMENTS

| | | | |
|---|---|---|---|
| 8,716,594 B2 | 5/2014 | Dutta | |
| 9,030,550 B2 | 5/2015 | Georgiev | |
| 9,780,131 B1 | 10/2017 | Woo et al. | |
| 9,954,020 B1 | 4/2018 | Lu et al. | |
| 10,811,453 B1* | 10/2020 | Mun | H01L 27/1464 |
| 2004/0100570 A1* | 5/2004 | Shizukuishi | H01L 27/14627 348/E9.01 |
| 2008/0018765 A1* | 1/2008 | Choi | H01L 27/14603 348/E3.018 |
| 2008/0142686 A1 | 6/2008 | Konno et al. | |
| 2011/0298074 A1* | 12/2011 | Funao | H01L 27/14605 257/432 |
| 2012/0086094 A1* | 4/2012 | Watanabe | H01L 23/481 257/E31.127 |
| 2012/0217602 A1* | 8/2012 | Enomoto | H01L 27/14654 257/E31.127 |
| 2013/0050526 A1 | 2/2013 | Keelan | |
| 2013/0200251 A1 | 8/2013 | Velichko | |
| 2014/0346628 A1* | 11/2014 | Okazaki | H01L 27/14645 257/432 |
| 2015/0001660 A1* | 1/2015 | Fukumizu | H01L 27/1464 438/69 |
| 2015/0091122 A1* | 4/2015 | Okazaki | H01L 27/1463 257/446 |
| 2015/0097213 A1* | 4/2015 | Chen | H01L 27/1464 438/60 |
| 2015/0162365 A1* | 6/2015 | Chang | H01L 27/14636 438/70 |
| 2015/0206921 A1* | 7/2015 | Imoto | H01L 27/14812 257/230 |
| 2015/0236066 A1* | 8/2015 | Tayanaka | H01L 27/14623 438/69 |
| 2016/0035770 A1 | 2/2016 | Ahn et al. | |
| 2016/0049430 A1* | 2/2016 | Nomura | H01L 27/14623 257/432 |
| 2016/0064430 A1* | 3/2016 | Lee | H01L 27/14623 257/292 |
| 2016/0372507 A1* | 12/2016 | Yang | H04N 25/76 |
| 2017/0338265 A1* | 11/2017 | Yoshiba | H04N 25/76 |
| 2018/0084185 A1 | 3/2018 | Lu et al. | |
| 2018/0160058 A1* | 6/2018 | Nakata | H01L 27/14623 |
| 2018/0277580 A1* | 9/2018 | Chiang | H01L 27/14645 |
| 2018/0308883 A1* | 10/2018 | Yanagita | H01L 27/14645 |
| 2019/0035838 A1* | 1/2019 | Byun | H01L 27/14605 |
| 2019/0067346 A1 | 2/2019 | Borthakur | |
| 2019/0096945 A1 | 3/2019 | Lu et al. | |
| 2019/0103430 A1* | 4/2019 | Tayanaka | H01L 27/14621 |
| 2019/0131328 A1* | 5/2019 | Kim | H01L 27/14643 |
| 2019/0131333 A1* | 5/2019 | Borthakur | H01L 27/14605 |
| 2019/0148448 A1* | 5/2019 | Lee | H01L 27/14627 257/431 |
| 2020/0013808 A1* | 1/2020 | Kumagai | H01L 27/1461 |
| 2021/0074751 A1* | 3/2021 | Bonakdar | H01L 27/14607 |
| 2021/0151482 A1* | 5/2021 | Phan | H01L 27/14621 |
| 2021/0183924 A1 | 6/2021 | Manda | |
| 2021/0193727 A1* | 6/2021 | Asatsuma | H01L 27/1464 |
| 2021/0202546 A1* | 7/2021 | Liu | H01L 27/1463 |
| 2021/0202554 A1* | 7/2021 | Liu | H01L 27/1462 |
| 2021/0233947 A1* | 7/2021 | Zang | H01L 27/14605 |
| 2021/0242259 A1* | 8/2021 | Bonakdar | H01L 27/14623 |
| 2021/0242262 A1* | 8/2021 | Bonakdar | H01L 27/14623 |

OTHER PUBLICATIONS

Kim, Y. et al., "High-Sensitivity Pixels with a Quad-WRGB Color Filter and Spatial Deep-Trench Isolation" Sensors 2019, 10 pages.

U.S. Appl. No. 16/777,060, Non-Final Office Action dated Oct. 27, 2021, 14 pages.

U.S. Appl. No. 16/777,090, Non-Final Office Action dated Dec. 7, 2021, 20 pages.

U.S. Appl. No. 16/777,193 Non-Final Office Action, dated Sep. 15, 2021, 12 pages.

* cited by examiner

FLARE-BLOCKING IMAGE SENSOR

RELATED APPLICATIONS

This application is a divisional application of U.S. patent application Ser. No. 16/777,027 filed Jan. 30, 2020, the entire content of which is incorporated herein by reference.

BACKGROUND

Camera modules in commercial products such as standalone digital cameras, mobile devices, automotive components, and medical devices include an image sensor having a pixel array. The pixel array includes a plurality of pixels arranged as a two-dimensional periodic array with a pixel pitch that is between two and three times the wavelength of light incident thereon. Many image sensors include a microlens array, formed of a plurality of microlenses each aligned to a respective pixel, that has two-dimensionally periodic surface height above the pixel array. The periodicity of the image sensor's pixel array and microlens array thereon result in the image sensor resembling a reflective two-dimensional diffraction grating. Part of light incident on the image sensor is diffracted toward the camera's imaging lens. Different elements of the camera, e.g., a cover glass, an IR-cut filter, a surface of the imaging lens, reflect this diffracted light back toward the image sensor, which produces an image artifact known as petal flare.

SUMMARY OF THE EMBODIMENTS

Embodiments disclosed herein reduce petal flare. In a first aspect, a flare-blocking image sensor includes a plurality of large pixels in a semiconductor substrate, and a plurality of small pixels in the semiconductor substrate. The plurality of large pixels form a first pixel array that has a pixel pitch $P_x$ and $P_y$ in respective orthogonal directions x and y each parallel to a top surface of the semiconductor substrate. The plurality of large pixels include a first large pixel. The plurality of small pixels form a second pixel array that has a pixel pitch $P_x$ and $P_y$ in respective directions x and y and is offset from the first pixel array by $½P_x$ and $½P_y$ in respective directions x and y. The first large pixel is between and collinear with a first and a second small pixel of the plurality of small pixels. The first and a second small pixel have a center-to-center separation equal to $\sqrt{P_x^2+P_y^2}$ in a first direction and each have, in the first direction, a small-pixel width W less than both pixel pitch $P_x$ and $P_y$. The flare-blocking image sensor also includes a large microlens and a first opaque element. The large microlens is aligned with the first large pixel. The first opaque element is in a plane parallel to the top surface and between the first large pixel and the large microlens. The first opaque element extends, in the first direction, a distance $d_1$ less than $$\frac{1}{2}\left(\sqrt{P_x^2 + P_y^2} - W\right)$$

from a boundary between the first small pixel and the first large pixel and toward the second small pixel. In a second direction perpendicular to the first direction, the first opaque element extends a first width less than or equal to small-pixel width W.

DETAILED DESCRIPTION OF THE EMBODIMENTS

Figure 1:
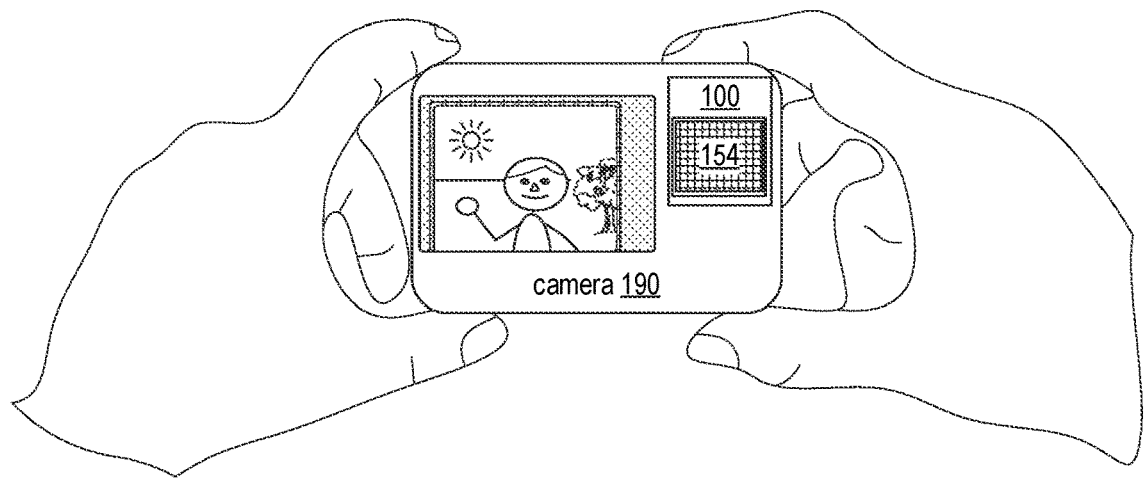
FIG. 1 depicts a camera imaging a scene, in an embodiment.

FIG. 1 shows an image sensor 100, which includes a pixel array 154. In the scenario depicted in FIG. 1, image sensor 100 is incorporated in a camera 190 imaging a scene. Camera 190 includes an image-sensor 100, which includes a pixel array 154. Image sensor 100 may be part of a chip-scale package or a chip-on-board package.

Figure 2:
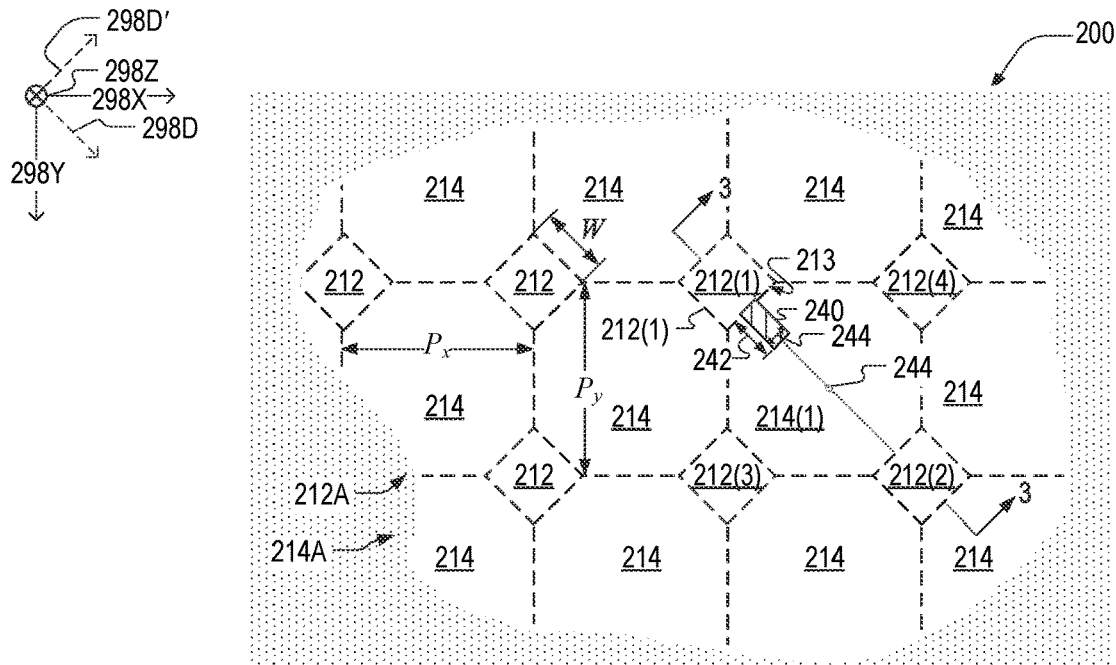
FIGS. 2 and 3 are respective cross-sectional schematics of a flare-blocking image sensor, which is an example an image sensor of the camera of FIG. 1, in an embodiment.

FIG. 2 is a cross-sectional schematic of a flare-blocking image sensor 200, which is an example of image sensor 100. The cross-section illustrated in FIG. 2 is parallel to a plane, hereinafter the x-y plane, formed by orthogonal directions 298X and 298Y, which are each orthogonal to direction 298Z. Herein, the x-y plane is formed by orthogonal directions 298X and 298Y, and planes parallel to the x-y plane are referred to as transverse planes. Unless otherwise specified, heights of objects herein refer to the object's extent in direction 298Z, or a direction 180° opposite thereto. FIG. 2 denotes a direction 298D that, with direction 298Z, forms a first diagonal plane, hereinafter the d-z plane. FIG. 2 also denotes a direction 298D' that, with direction 298Z, forms a second diagonal plane, hereinafter the d'-z plane.

Figure 3:
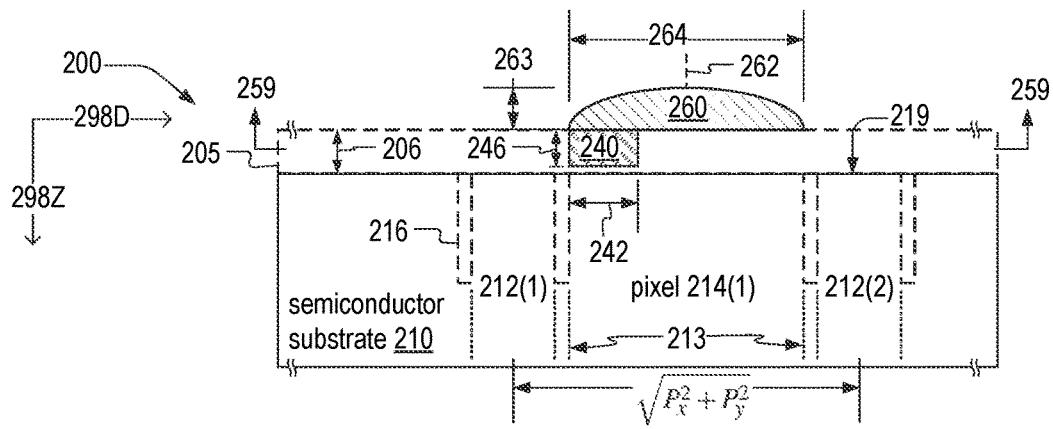

FIG. 3 is a cross-sectional schematic of flare-blocking image sensor 200. FIG. 2 denotes cross-sectional plane 3 which is a cross-sectional plane of FIG. 3. Cross-sectional plane 3 is parallel to the d-z plane. FIG. 3 indicates a cross-sectional plane 259, which is the cross-sectional plane of FIG. 2. For sake of clarity, FIG. 2 illustrates elements of semiconductor substrate 210 beneath cross-sectional plane 259; these elements are illustrated with dashed lines. FIGS. 2 and 3 are best viewed together in the following description.

Image sensor 200 includes a semiconductor substrate 210, a plurality of small pixels 212 and a plurality of large pixels 214 formed therein, a microlens 260, and an opaque element 240. A technical benefit of opaque element 240 is to prevent the aforementioned petal flare caused by stray light diffracted by image sensor 200.

In embodiments, image sensor 200 includes an intermediate layer 205 between microlens 260 and semiconductor substrate 210. Intermediate layer 205 may include at least one of a spectral filter and a buffer oxide layer.

Semiconductor substrate 210 has a top substrate surface 219, which may be perpendicular to direction 298Z. The plurality of large pixels 214 form a pixel array 214A that has a pixel pitch $P_x$ and $P_y$ in respective orthogonal directions x and y. The plurality of large pixels 214 include a large pixel 214(1).

The plurality of small pixels 212 form a pixel array 212A that has a pixel pitch $P_x$ and $P_y$ in respective directions x and y. Pixel array 212A is offset from pixel array 214A by $½P_x$ and $½P_y$ in respective directions x and y. The plurality of small pixels 212 includes a first small pixel 212(1) and a second small pixel 212(2), which have a center-to-center separation equal to $\sqrt{P_x^2+P_y^2}$ in direction 298D. Each of small pixels 212(1) and 212(2) have a small-pixel width W, in direction 298D, that is less than both pixel pitch $P_x$ and $P_y$. Each of the plurality of small pixels 212 has a width equal to small-pixel width W in one or both of directions 298D and direction 298D'. Large pixel 214(1) is between and collinear with small pixels 212(1) and 212(2). In embodiments, each of pixel pitch $P_x$ and $P_y$ exceeds small-pixel width W by at least a factor of two. In embodiments, microlens 260 is center-aligned between small pixels 212(1) and 212(2).

The plurality of small pixels 212 includes small pixels 212(3) and 212(4), which have a center-to-center spacing $\sqrt{P_x^2+P_y^2}$. In embodiments, large pixel 214(1) is between and collinear with small pixels 212(3) and 212(4), such that small pixels 212(1-4) are located at respective corners of a $P_x$-by-$P_y$ rectangle center-aligned with large pixel 214(1).

Cross-sectional plane 3 bisects small pixels 212(1,2) and intersects a center of large pixel 214(1). When $P_y=P_x$, directions 298D and 298D' are perpendicular.

FIGS. 2 and 3 denote a boundary 213 between adjacent pixels of semiconductor substrate 210. In embodiments, image sensor 200 includes a deep-trench isolation layer 216 between adjacent pixels, such that at least a portion of boundary 213 corresponds to a material interface between a deep-trench isolation layer 216 and semiconductor substrate 210. In embodiments, deep-trench isolation layer 216 includes an oxide.

Microlens 260 is aligned with large pixel 214(1) and has an optical axis 262, which may perpendicular to top substrate surface 219. Image sensor 200 may include a plurality of microlenses 260 that form a microlens array. In embodiments, a microlens 260 qualifies as being aligned to large pixel 214(1) when any part of the microlens 260 is directly above large pixel 214(1). In embodiments, optical axis 262 is aligned with a center of large pixel 214(1) in both directions 298X and 298Y, and all of microlens 260 is directly above large pixel 214(1). In embodiments, at least part of microlens 260 is directly above large pixel 214(1), while optical axis 262 is offset from a center of large pixel 214(1) in at least one direction 298X and 298Y. In such embodiments, microlens 260 qualifies as being aligned to large pixel 214(1). In embodiments, at least part of multiple microlenses 260 of the microlens array is above large pixel 214(1). Of these microlenses 260, the microlens 260 that is closest to the center of pixel array 214A (in the x-y plane) qualifies as the microlens that is aligned to the large pixel 212(1).

Opaque element 240 is in cross-sectional plane 259, which is parallel to top substrate surface 219 and between the large pixel 214(1) and microlens 260. Opaque element 240 extends, in direction 298D, a length 242 from boundary 213 toward second small pixel 212(2). Length 242 in less than $$L_1 = \frac{1}{2}\left(\sqrt{P_x^2+P_y^2} - W\right)$$

such that opaque element 240 does not extend to a midpoint 215 between small pixels 212(1) and 212(2). In embodiments, length $$\frac{1}{2}\left(\sqrt{P_x^2+P_y^2} - W - d_{spot}\right)$$

such that opaque element 240 does not block light focused to a spot size $d_{spot}$ by microlens 260.

In embodiments, opaque element 240 is formed of a metal. For example, opaque element 240 may be formed of tungsten, which is absorptive at visible wavelengths, and hence reduces petal flare artifacts by absorbing diffracted light incident thereon. Opaque element 240 may be formed of a lossy dielectric, such as an organic material, that has a complex refractive index $\mathcal{N} = n_{240}+i\kappa$, where $n_{240} \approx n_{205}$ to minimize reflectivity of opaque element 240 when the incident medium has refractive index $n_{205}$. Refractive index $n_{205}$ is the refractive index of a medium, e.g., intermediate layer 205, between microlens 360 and top substrate surface 319. For example, $n_{240}=n_{205}\pm 0.15$, and/or $n_{240}$ is between 1.35 and 1.65.

In embodiments, $d_{spot}$ is a diffraction-limited spot size equal to $c_1\lambda/NA$, where $NA=\sqrt{P_x^2+P_y^2}/2f$ is the numerical aperture of microlens 260, f is the focal length of microlens 260, and $\lambda$ wavelength of illumination in a medium between microlens 360 and top substrate surface 319. In embodiments, $\lambda=\lambda_0/n_{205}$, where $\lambda_0$ is a free-space electromagnetic wavelength. In embodiments, intermediate layer 205 includes a spectral filter beneath microlens 360 that has a passband defined by a minimum wavelength $\lambda_{min}$ and a maximum wavelength $\lambda_{max}$, and $L_1$ may equal $$\frac{1}{2}\left(\sqrt{P_x^2+P_y^2} - W - \lambda_{max}/NA\right).$$

Free-space electromagnetic wavelength $\lambda_0$ may be between 0.4 μm and 1.6 μm. Refractive index $n_{205}$ may be between 1.4 and 1.6. The value of coefficient $c_1$ depends on the shape of microlens 260's exit pupil, for example, $c_1=1.0$ and $c_1=1.22$ when the shape is rectangular and circular, respectively. When $P_x=P_y$, $NA=\sqrt{2}P_x/2f$.

Opaque element 230 has a thickness 246 in direction 298Z. Thickness 246 may be less than thickness 206, in which case some diffracted light incident on surface 219 incurs multiple reflections between surface 219 and a bottom surface of opaque element 240. In embodiments, thickness 206 exceeds thickness 246 by less than $\lambda/2$, where $\lambda=\lambda_0/n_{205}$, and $\lambda_0$ may equal $\lambda_{max}$. The amplitude of such light decays exponentially. To ensure that this light does not reach small pixel 212, length 242 exceeds $\lambda/2$ such that it is absorbed by opaque element 240.

A geometrical optics approximation of focal length is $f=n_{205}R/(n_{260}-1)$, where R is the radius of curvature of microlens 260, $n_{260}$ is the refractive index of microlens 260. Microlens 260 has a diameter 264 and a height 263. In embodiments, $$R = \frac{1}{2}(h_L + r^2/h_L),$$

where radius r is one-half of lens diameter 264 and $h_L$ equals height 263, as described in Ph. Nussbaum et al 1997 *Pure Appl. Opt.* 6 617. In embodiments, $|n_{260}-n_{205}|<0.1$.

In embodiments, length 242 from boundary 213 of small pixel 212(1) depends on the location of large pixel 214(1) in pixel array 214A. For example, length 242 may depend on the chief-ray angle of light transmitted by the imaging lens of camera 190 incident on large pixel 214(1). Length 242 may also depend on relative positions of opaque element 240 and center of large pixel 214(1) relative to a center of pixel array 214A. For example, a first opaque element 240 may be between a center of pixel array 214A and center of large pixel 214(1), while the center of pixel array 214A is between a second opaque element 240 and the center of large pixel 214(1).

In direction 298Z, opaque element 240 has a thickness 246 which, in embodiments, exceeds an intensity penetration depth $\delta$ of opaque element 240 at free-space electromagnetic wavelength $\lambda_0$, $\delta=\lambda_0/(\pi\kappa)$, where $\kappa$ is the imaginary part of opaque element 240's refractive index at wavelength $\lambda_0$. In embodiments, thickness 246 is between 75 and 125 nanometers.

Opaque element 240 reduces petal flare by blocking diffracted illumination. However, opaque element 240 also blocks image illumination propagating directly to large pixel 214(1) from camera 190's imaging lens. Opaque element 240 has a width 244 in a directional perpendicular to length 242. In an embodiment, width 244 of opaque element 240 is less than or equal to small-pixel width W, such that opaque element 240 blocks diffracted light (resulting in petal flare) while the amount of non-stray light it blocks is reduced. In embodiments, width 244 exceeds intensity penetration depth $\delta$ and is less than small-pixel width W. Width 244 may be between 80 nanometers and 120 nanometers. In an embodiment, small-pixel width W exceeds width 244 by a factor between eight and twelve.

Width 244 being less than small-pixel width W results from the realization that diffraction orders that result in petal flare are strongest in the diagonal planes (a plane parallel to one of d-z and d'-z) that intersect the optical axis of the microlenses 260 and the center of small pixels 212. In such planes, the microlenses are shaped (generally) such that reflected/diffracted light remains in the plane because the microlens has zero or near-zero slope in a perpendicular plane. In off-center diagonal planes that intersect small pixels 212 (but not the centers of the small pixels), microlens 260 has a non-zero slope in both the off-center diagonal plane and the plane perpendicular thereto, such that light is reflected/diffracted out of the off-center diagonal plane and is less likely to reach small pixels intersected by the off-center diagonal plane.

Figure 4:
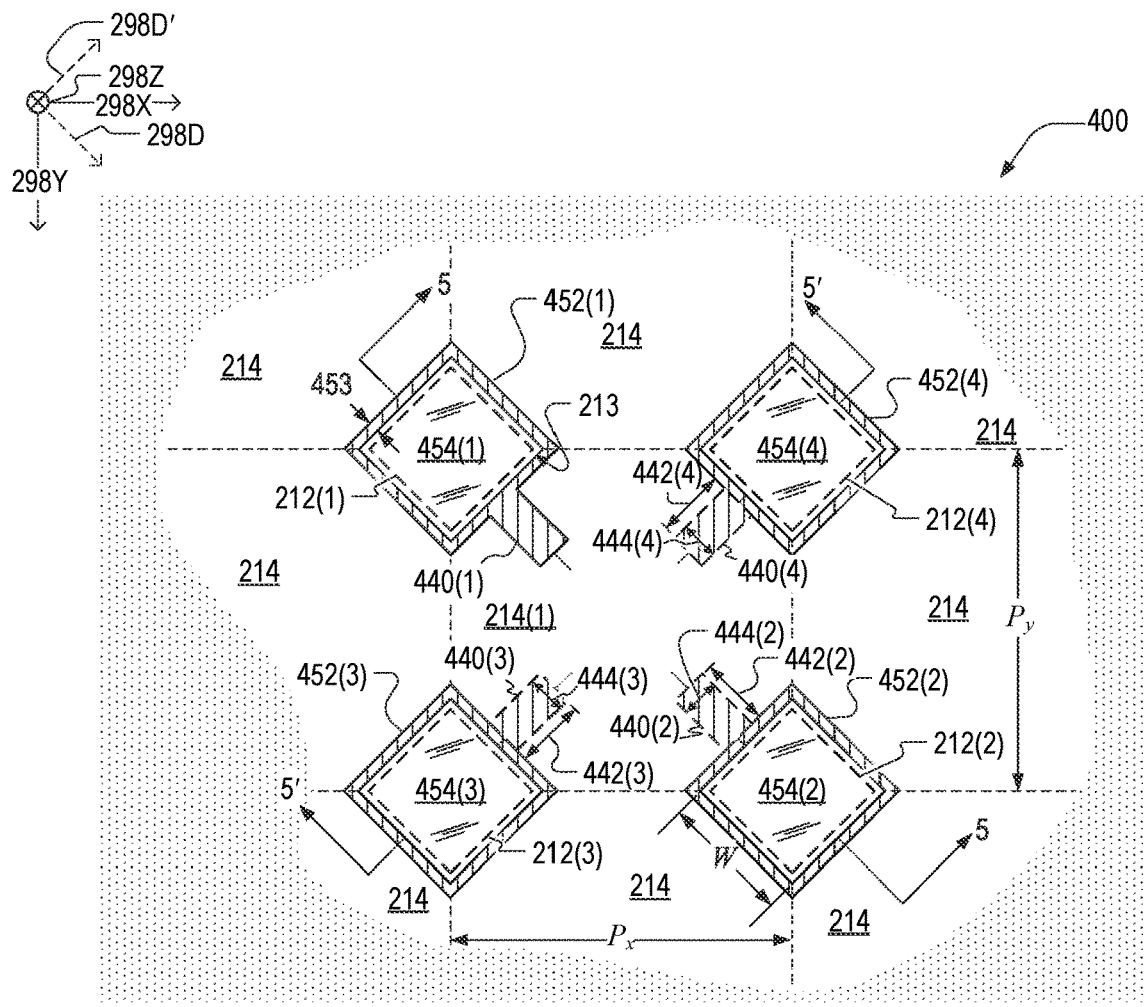
FIGS. 4 and 5 are respective cross-sectional schematics of a flare-blocking image sensor, which is an example the flare-blocking image sensor of FIGS. 2 and 3.
Figure 5:
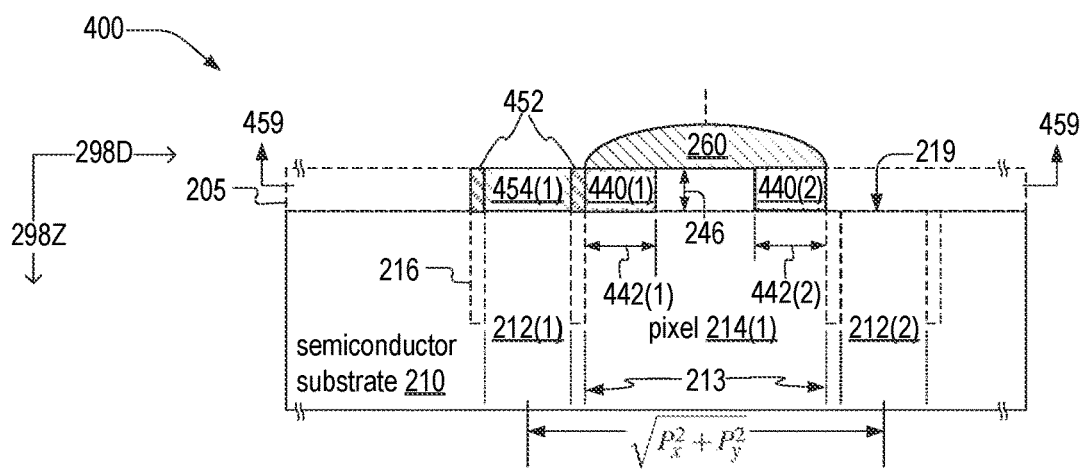

FIGS. 4 and 5 are respective cross-sectional schematics of a flare-blocking image sensor 400, which is an example of image sensor 200 in which small pixel 212(1) includes an opaque annulus 452(1). FIG. 4 denotes cross-sectional planes 5 and 5', at least one of which is a cross-sectional plane of FIG. 5. FIG. 5 denotes a cross-sectional plane 459, which is the cross-sectional plane of FIG. 4. FIGS. 4 and 5 are best viewed together in the following description.

In embodiments, opaque annulus 452(1) is center-aligned with a microlens aligned with small pixel 212(1). Opaque annulus 452(1) includes an opaque extension 440(1) that is monolithically formed with opaque annulus 452. Opaque extension 440(1) is an example of opaque element 240. Opaque annulus 452(1) has a width 453, which in embodiments is between 100 nanometers and 120 nanometers.

In embodiments, image sensor 400 includes a spectral filter 454(1) that intersects plane 459, is aligned to small pixel 212(1), and is surrounded by opaque annulus 452(1). In embodiments, opaque annulus 452 adjoins spectral filter 454(1). In embodiments, respective centers of spectral filter 454(1) and small pixel 212(1) are laterally offset, for example, when small pixel 212(1) is near an edge of image sensor 200 and light incident thereon has a relatively large chief-ray angle, exceeding fifteen degrees for example.

In embodiments, image sensor 400 includes a spectral filter array 454A that includes an array of spectral filters 454, of which spectral filter 454(1) is one. Each spectral filter 454 intersects plane 459 and is aligned to a respective small pixel 212. Spectral filter 454(2) is aligned to small pixel 212(2). Image sensor 400 also includes a plurality of opaque annuli 452. Opaque annulus 452(1) is one of opaque annuli 452. FIG. 4 denotes opaque annulus 452(2) surrounding spectral filter 454(2). When image sensor 400 includes spectral filter array 454A, each opaque annulus 452 surrounds a respective small spectral filter 454. Each spectral filter 454 may be an absorptive filter, a dichroic filter, a plasmonic filter, or a combination thereof.

When image sensor 400 includes intermediate layer 205, intermediate layer 205 may include a buffer oxide layer between deep-trench isolation structure 216 and opaque annulus 452. One source of petal flare is diffracted light that propagates through the buffer oxide layer between opaque annulus 452 and deep-trench isolation structure 216.

In embodiments, image sensor 400 also includes a plurality of opaque extensions 440, each of which may be monolithically formed with and extending from a respective one of opaque annuli 452 in one of direction 298D and direction 298D'. Each opaque extension 440 is an example of, and similar to, opaque extension 440(1). One function of opaque extensions 440 is to reduce petal flare by diffracted light from propagating between opaque annulus 452 and deep-trench isolation structure 216.

FIG. 4 denotes opaque extension 440(2) that intersects plane 459, and extends a length 442(2) less than $L_1$ opposite the first direction from (i) a boundary between small pixel 212(2) and large pixel 214(1) toward (ii) small pixel 212(1), and having, in direction 298D', a width 444 less than or equal to small-pixel width W. In embodiments, width 444 equals width 453.

When flare-blocking image sensor 400 includes opaque annulus 452(2), opaque extension 440(2) may be monolithically formed with opaque annulus 452(2). Herein, boundary 213 is an example of a boundary between a small pixel 212 adjacent to large pixel 214(1).

In embodiments, flare-blocking image sensor 400 includes opaque extensions 440(3) and 440(4), each intersecting plane 459. In direction 298D', opaque extension 440(3) extends length 442(3) less than $L_1$ from (i) a boundary between the small pixel 212(3) and the large photo-diode pixel 214(1) toward (ii) small pixel 212(4). In direction 298D, opaque extension 440(3) has a width 444(3) that is less than or equal to small pixel-width W. In direction 298D', opaque extension 440(4) extends length 442(4) less than $L_1$ from (i) a boundary between the small pixel 212(4) and the large photo-diode pixel 214(1) toward (ii) small pixel 212(3). In direction 298D, opaque extension 440(4) has a width 444(4) that is less than or equal to small pixel-width W. In embodiments, no one of opaque extensions 440 is in contact with a different one of opaque extensions 440.

In embodiments, opaque annuli 452 include opaque annuli 452(3) and 452(4) aligned with small pixels 212(3) and 212(4). When flare-blocking image sensor 400 includes opaque annuli 452(3) and 452(4) and opaque extensions 440(3) and 440(3), opaque extensions 440(3) and 440(3) are monolithically formed with respective opaque annuli 452(3) and 452(4). When flare-blocking image sensor 400 includes spectral filter array 454A, spectral filters 454(3) and 454(4) are aligned with small pixels 212(3) and 212(4), and are surrounded by opaque annuli 452(3) and 452(4), respectively. When flare-blocking image sensor 400 includes opaque extensions 440(3) and 440(3), opaque annuli 452(3) and 452(4), and spectral filters 454(3) and 454(4), FIG. 5 represents a cross-section of flare-blocking image sensor 400 in a cross-sectional plane 5', with indices (3) and (4)

replacing indices (1) and (2), respectively. Cross-sectional plane 5' is parallel to the d'-z plane.

Figure 6:
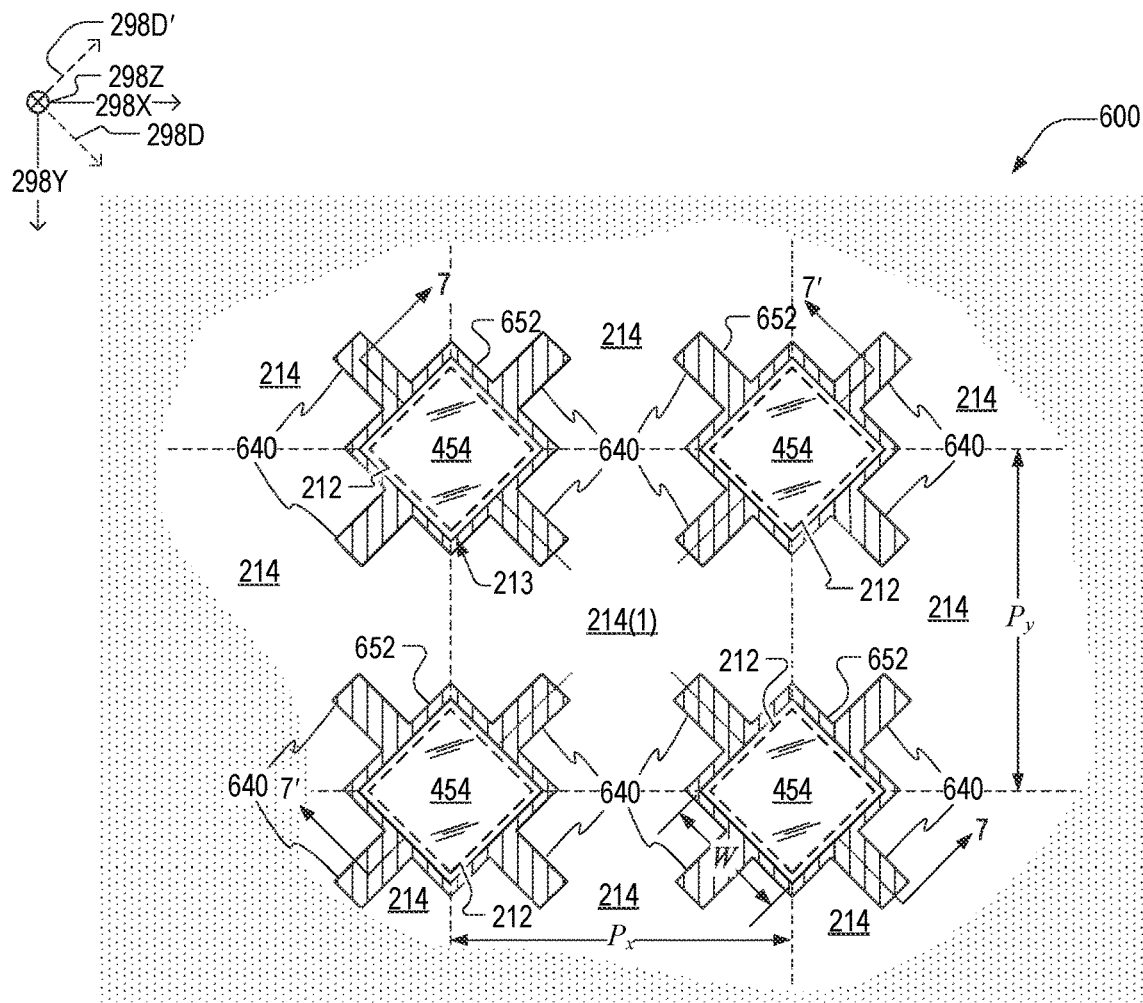
FIGS. 6 and 7 are respective cross-sectional schematics of a flare-blocking image sensor, which is an example of the flare-blocking image sensor of FIGS. 4 and 5.
Figure 7:
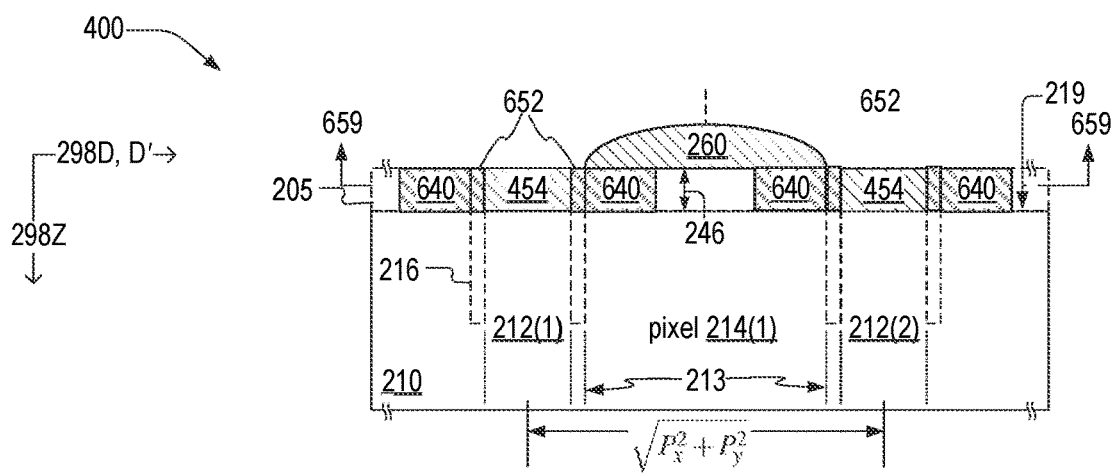

FIGS. 6 and 7 are respective cross-sectional schematics of a flare-blocking image sensor 600. Flare-blocking image sensor 600 is an example of flare-blocking image sensor 400 in which, for a plurality of small pixels 212, a respective opaque annulus 652 is aligned thereto. FIG. 6 denotes cross-sectional planes 7 and 7', each of which is the cross-sectional plane of FIG. 7. FIG. 7 denotes a cross-sectional plane 659, which is the cross-sectional plane of FIG. 6. FIGS. 6 and 7 are best viewed together in the following description.

Opaque annulus 652 is an example of opaque annulus 452 that includes four opaque extensions 640, at least one of which may be monolithically formed with opaque annulus 652. Each opaque extension 640 is an example of opaque extension 440. Each opaque annulus 652 includes (a) two opaque extensions 640 extending away from a center of the opaque annulus 652 along direction 298D, and (b) two opaque extensions 640 extending away from a center of the opaque annulus 652 along direction 298D'.

Combinations of Features

Features described above as well as those claimed below may be combined in various ways without departing from the scope hereof. The following enumerated examples illustrate some possible, non-limiting combinations.

(A1) A flare-blocking image sensor includes a plurality of large pixels in a semiconductor substrate, and a plurality of small pixels in the semiconductor substrate. The plurality of large pixels forms a first pixel array that has a pixel pitch $P_x$ and $P_y$ in respective orthogonal directions x and y each parallel to a top surface of the semiconductor substrate. The plurality of large pixels includes a first large pixel. The plurality of small pixels forms a second pixel array that has a pixel pitch $P_x$ and $P_y$ in respective directions x and y and is offset from the first pixel array by $\frac{1}{2}P_x$ and $\frac{1}{2}P_y$ in respective directions x and y. The first large pixel is between and collinear with a first and a second small pixel, of the plurality of small pixels. The first and second small pixels have a center-to-center separation equal to $\sqrt{P_x^2+P_y^2}$ in a first direction. The first and second small pixels each have, in the first direction, a small-pixel width W less than both pixel pitch $P_x$ and $P_y$. The flare-blocking image sensor also includes a large microlens and a first opaque element. The large microlens is aligned with the first large pixel. The first opaque element is in a plane parallel to the top surface and between the first large pixel and the large microlens. The first opaque element extends, in the first direction, a distance $d_1$ less than $$\frac{1}{2}\left(\sqrt{P_x^2 + P_y^2} - W\right)$$

from a boundary between the first small pixel and the first large pixel toward the second small pixel. In a second direction perpendicular to the first direction, the first opaque element extends a first width less than or equal to small-pixel width W.

(A2) In the image sensor (A1) the first width may be less than or equal to one-third of small-pixel width W.

(A3) In an image sensor according to one of (A1) and (A2), a thickness of the first opaque element in a direction perpendicular to the top surface may be between 75 and 125 nanometers.

(A4) In an image sensor according to one of (A1)-(A3), the first opaque element may be formed of metal.

(A5) Any image sensor according to one of (A1)-(A4) may further include an opaque annulus center-aligned with a microlens aligned with the first small pixel, the first opaque element being an extension of, and monolithically formed with, the opaque annulus.

(A6) Any image sensor (A5) may further include a spectral filter intersecting the plane and aligned to the first small pixel and surrounded by the opaque annulus.

(A7) Any image sensor according to one of (A5) and (A6) may further include (i) a spectral filter array intersecting the plane and including a plurality of spectral filters each aligned to a respective small pixel of the plurality of small pixels, and (ii) a plurality of opaque annuli each surrounding a respective spectral filter of the plurality of spectral filters, each opaque annulus of the plurality of opaque annuli being an instance of the opaque annulus.

(A8) Any image sensor (A7) may further include a plurality of opaque elements each being monolithically formed with and extending from a respective one of the plurality of opaque annuli in one of the first direction and the second direction.

(A9) Any image sensor according to one of (A1)-(A8) may further include a second opaque element in the plane, extending a distance $d_2$ less than $$\frac{1}{2}\left(\sqrt{P_x^2 + P_y^2} - W\right)$$

opposite the first direction from (i) a boundary between the second small pixel and the first large pixel toward (ii) the first small pixel, and having, in the second direction, a second width less than or equal to small-pixel width W.

(A10) In any image sensor (A9), the first large pixel may be between and collinear with a third and a fourth small pixel, of the plurality of small pixels, having center-to-center spacing $\sqrt{P_x^2+P_y^2}$, and the first, second, third, and fourth small pixels may be located at respective corners of a $P_x$-by-$P_y$ rectangle center-aligned with the first large pixel. Any such image sensor (A9) may further include: (i) a third opaque element in the plane, extending, in a third direction a, distance $d_3$ less than $$\frac{1}{2}\left(\sqrt{P_x^2 + P_y^2} - W\right)$$

from a boundary between the third small pixel and the large photo-diode pixel toward the fourth small pixel, and having, in a fourth direction perpendicular to the third direction, a third width less than or equal to small pixel-width W, and (ii) a fourth opaque element in the plane, extending a distance $d_4$ less than $$\frac{1}{2}\sqrt{P_x^2 + P_y^2}$$

opposite the third direction from a boundary between the fourth small pixel and the large photo-diode pixel toward the third small pixel, and having, in the fourth direction, a fourth width less than or equal to small pixel-width W.

(A11) In embodiments of image sensor (A10), no one of the first, second, third, and fourth opaque elements is in contact with another one of the first, second, third, and fourth opaque elements.

(A12) In any image sensor according to one of (A1)-(A11) each of pixel pitch $P_x$ and pixel pitch $P_y$ may exceed the pixel-width of the first small pixel.

(A13) Any image sensor according to one of (A1)-(A12), may further include, when the large microlens has a numeral aperture NA, a spectral filter located between the large microlens and the first large pixel and having a passband defined by a minimum wavelength $\lambda_{min}$ and a maximum wavelength $\lambda_{max}$, distance $d_1$ being less than $$\frac{1}{2}\left(\sqrt{P_x^2 + P_y^2} - W - \lambda_{max}/NA\right).$$

(A14) In any image sensor (A13), distance $d_1$ may exceed $$\frac{1}{6}\left(\sqrt{P_x^2 + P_y^2} - W - \lambda_{max}/NA\right).$$

(A15) in any image sensor (A13), distance $d_1$ may exceed $\lambda_{max}/(2n)$, where n is a refractive index of a medium between the first opaque element and the top surface.

(A16) In any image sensor (A1)-(A15), at least part of the large microlens may be directly above the first large pixel.

Changes may be made in the above methods and systems without departing from the scope of the present embodiments. It should thus be noted that the matter contained in the above description or shown in the accompanying drawings should be interpreted as illustrative and not in a limiting sense. Herein, and unless otherwise indicated the phrase "in embodiments" is equivalent to the phrase "in certain embodiments," and does not refer to all embodiments. The following claims are intended to cover all generic and specific features described herein, as well as all statements of the scope of the present method and system, which, as a matter of language, might be said to fall therebetween.

What is claimed is:

1. A flare-blocking image sensor comprising:
   a plurality of large pixels in a semiconductor substrate and forming a first pixel array that has a pixel pitch $P_x$ and $P_y$ in respective orthogonal directions x and y each parallel to a top surface of the semiconductor substrate, the plurality of large pixels including a first large pixel;
   a plurality of small pixels in the semiconductor substrate and forming a second pixel array that has a pixel pitch $P_x$ and $P_y$ in respective directions x and y and is offset from the first pixel array by ½$P_x$ and ½$P_y$ in respective directions x and y, the first large pixel being between and collinear with a first and a second small pixel, of the plurality of small pixels, having a center-to-center separation equal to $\sqrt{P_x^2+P_y^2}$ in a first direction, each of the first and second small pixels having, in the first direction, a small-pixel width W less than both pixel pitch $P_x$ and $P_y$;
   a large microlens aligned with the first large pixel; and
   a first opaque extension in a plane parallel to the top surface and between the first large pixel and the large microlens, extending, in the first direction, a distance $d_1$ less than $$\frac{1}{2}\left(\sqrt{P_x^2 + P_y^2} - W\right)$$

from (i) a boundary between the first small pixel and the first large pixel toward (ii) the second small pixel, and having, in a second direction perpendicular to the first direction, a first width less than or equal to small-pixel width W, wherein small-pixel width W exceeds the first width by a factor between eight and twelve.

2. The image sensor of claim 1, the first width being less than or equal to one-third of small-pixel width W.

3. The image sensor of claim 1, a thickness of the first opaque extension in a direction perpendicular to the top surface being between 75 nanometers and 125 nanometers.

4. The image sensor of claim 1, the first opaque extension being formed of metal.

5. The image sensor of claim 1, further comprising an opaque annulus center-aligned with a microlens aligned with the first small pixel, the first opaque extension being an extension of, and monolithically formed with, the opaque annulus.

6. The image sensor of claim 5, further comprising a spectral filter intersecting the plane and aligned to the first small pixel and surrounded by the opaque annulus.

7. The image sensor of claim 5, further comprising:
   a spectral filter array intersecting the plane and including
      a plurality of spectral filters each aligned to a respective small pixel of the plurality of small pixels; and
      a plurality of opaque annuli each surrounding a respective spectral filter of the plurality of spectral filters, each opaque annulus of the plurality of opaque annuli being an instance of the opaque annulus.

8. The image sensor of claim 7, further comprising: a plurality of opaque elements each being monolithically formed with and extending from a respective one of the plurality of opaque annuli in one of the first direction and the second direction.

9. The image sensor of claim 1, further comprising:
   a second opaque element in the plane, extending a distance $d_2$ less than $$\frac{1}{2}\left(\sqrt{P_x^2 + P_y^2} - W\right)$$

opposite the first direction from (i) a boundary between the second small pixel and the first large pixel (ii) toward the first small pixel, and having, in the second direction, a second width less than or equal to small-pixel width W.

10. The image sensor of claim 9, the first large pixel being between and collinear with a third and a fourth small pixel, of the plurality of small pixels, having center-to-center spacing $\sqrt{P_x^2+P_y^2}$, the first, second, third, and fourth small pixels being located at respective corners of a $P_x$-by-$P_y$ rectangle center-aligned with the first large pixel, the flare-blocking image sensor further comprising:
  a third opaque element in the plane, extending, in a third direction a, distance $d_3$ less than $$\frac{1}{2}\left(\sqrt{P_x^2 + P_y^2} - W\right)$$

from (i) a boundary between the third small pixel and the large pixel toward (ii) the fourth small pixel, and having, in a fourth direction perpendicular to the third direction, a third width less than or equal to small pixel-width W; and
  a fourth opaque element in the plane, extending a distance $d_4$ less than $$\frac{1}{2}\sqrt{P_x^2 + P_y^2}$$

opposite the third direction from a boundary between (i) the fourth small pixel and the large pixel toward (ii) the third small pixel, and having, in the fourth direction, a fourth width less than or equal to small pixel-width W.

11. The image sensor of claim 10, no one of the first, second, third, and fourth opaque elements being in contact with another one of the first, second, third, and fourth opaque elements.

12. The image sensor of claim 1, each of pixel pitch $P_x$ and pixel pitch $P_y$ exceeding the pixel-width of the first small pixel.

13. The image sensor of claim 1, the large microlens having a numeral aperture NA, and further comprising:
  a spectral filter located between the large microlens and the first large pixel and having a passband defined by a minimum wavelength $\lambda_{min}$ and a maximum wavelength $\lambda_{max}$,
distance $d_1$ being less than $$\frac{1}{2}\left(\sqrt{P_x^2 + P_y^2} - W - \lambda_{max}/NA\right).$$

14. The image sensor of claim 13, distance $d_1$ exceeding $$\frac{1}{6}\left(\sqrt{P_x^2 + P_y^2} - W - \lambda_{max}/NA\right).$$

15. The image sensor of claim 13, distance $d_1$ exceeding $\lambda_{max}/(2n)$, where n is a refractive index of a medium between the first opaque extension and the top surface.

16. The image sensor of claim 1, at least part of the large microlens being directly above the first large pixel.

* * * * *